United States Patent
Nogami et al.

(10) Patent No.: US 6,235,632 B1
(45) Date of Patent: May 22, 2001

(54) TUNGSTEN PLUG FORMATION

(75) Inventors: Takeshi Nogami, Sunnyvale; Guarionex Morales, Santa Clara; Minh Van Ngo, Union City, all of CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/006,495

(22) Filed: Jan. 13, 1998

(51) Int. Cl.[7] .................................................. H01L 21/44
(52) U.S. Cl. .................. 438/675; 438/637; 438/643; 438/629; 438/633; 438/627; 438/685; 438/648
(58) Field of Search .................................. 438/675, 685, 438/633, 687, 629, 672, 648, 643, 627, 637–640, 624

(56) References Cited

U.S. PATENT DOCUMENTS

| | | | |
|---|---|---|---|
| 5,877,075 | * 3/1999 | Dai et al. | 438/597 |
| 5,920,790 | * 7/1999 | Wetzel et al. | 438/618 |
| 5,939,788 | * 8/1999 | McTeer | 257/751 |
| 5,966,634 | * 10/1999 | Inohara et al. | 438/687 |
| 6,033,584 | * 3/2000 | Ngo et al. | 438/694 |
| 6,051,492 | * 4/2000 | Park et al. | 438/637 |
| 6,093,642 | * 7/2000 | Cho et al. | 438/643 |

FOREIGN PATENT DOCUMENTS

WO98/23389 * 6/1998 (WO).

* cited by examiner

*Primary Examiner*—Charles Bowers
*Assistant Examiner*—Thanh Nguyen
(74) *Attorney, Agent, or Firm*—Davis Chin

(57) ABSTRACT

In a preferred embodiment, there is disclosed a method of forming a tungsten plug at the via level. A metal line is formed in a top portion of a first insulating layer. A second insulating layer is formed on the first insulating layer and over an exposed surface of the metal line. An etching process is applied to a region of the second insulating layer formed over the exposed surface of the metal line to create a contact hole within the region. The metal line is exposed at the region. A tungsten nitride thin film is deposited over the second insulating layer and the exposed metal line. A blanket tungsten thin film is deposited to fill the contact hole and to form a planar layer successively to the depositing of the tungsten nitride thin film. The tungsten nitride thin film and the blanket tungsten thin film are chemically mechanically polished until the upper surface of the second insulating layer is exposed.

2 Claims, 2 Drawing Sheets

TUNGSTEN PLUG FORMATION

BACKGROUND OF THE INVENTION

1. Field of the Invention

This invention relates generally to the formation of a tungsten plug and more particularly, it relates to the formation of a barrier layer utilizing tungsten nitride prior to the chemical vapor deposition (CVD) of tungsten in a single chamber used for manufacturing a tungsten plug, for forming a contact gate in Flash EEPROM memory devices, and for forming local interconnects to CMOS gate structures.

2. Description of the Prior Art

As is generally well-known in the art of manufacturing of integrated circuits, a barrier layer is often required to be formed to prevent the diffusion of one type of material to another type of an adjacent material. In the past, titanium nitride (TN) had been used as the material for forming the diffusion barrier layer where conductive interfaces are needed to be maintained.

For example, in a conventional tungsten plug formation process, a sputtering or chemical vapor deposition (CVD) process is used for the formation of a titanium nitride layer on a substrate having a contact hole formed therein prior to the CVD of tungsten to fill the contact hole. However, since two different film formation processes are involved, there is required a first type of equipment for use in the deposition of the titanium nitride and a second different type of equipment for use in the deposition of the tungsten. As a result, the use of these two different process steps increases significantly the cost for the conventional tungsten plug formation process. In addition, in the formation of the conventional tungsten plug there is required a first subsequent process step to remove the tungsten and a second subsequent process step to remove the titanium nitride on the field region in order to form the tungsten plug, such as etching back and chemical-mechanical polishing (CMP). Therefore, since different chemistry is used in these removal steps, this also leads to a complicated process sequence.

It is apparent from the foregoing discussion that there still exists a need for a tungsten plug formation process, which requires only a single deposition chamber so as to reduce significantly the processing cost. This is achieved in the present invention by the formation of tungsten nitride by a plasma-enhanced CVD to be used as the barrier metal instead of titanium nitride, which is followed by a blanket tungsten film CVD made in the same deposition chamber.

SUMMARY OF THE INVENTION

Accordingly, it is a general object of the present invention to provide a method for forming a barrier layer utilizing tungsten nitride prior to the chemical vapor deposition of tungsten in a single chamber.

It is an object of the present invention to provide a method of fabricating a tungsten plug utilizing a tungsten nitride layer prior to the chemical vapor deposition of tungsten in a single chamber so as to yield a higher through-put and a lower production cost.

It is another object of the present invention to provide a method for forming a contact gate in Flash EEPROM memory devices utilizing a tungsten nitride layer prior to the chemical vapor deposition of tungsten in a single chamber so that the tungsten nitride deposition is made without requiring a seed layer.

It is still another object of the present invention to provide a method for forming local interconnects to CMOS gate structures utilizing a tungsten nitride layer prior to the chemical vapor deposition of tungsten in a single chamber which exhibits a lower resistivity and a high thermal stability and is simpler to etch.

It is yet still another object of the present invention to provide a method for forming a barrier layer utilizing tungsten nitride prior to the chemical vapor deposition of tungsten in a single chamber so as to simplify the subsequent chemical-mechanical polishing process.

In accordance with a preferred embodiment of the present invention, there is provided a method of fabricating a tungsten plug at the via level. A metal line is formed in a top portion of a first insulating layer. A second insulating layer is formed on the first insulating layer and over an exposed surface of the metal line. The exposed surface of the metal line may be copper, copper silicide, or titanium nitride depending on the specific structure of the metal line. An etching process is applied to a region of the second insulating layer formed over the exposed surface of the metal line to create a contact hole within the region. The metal line is exposed in the region.

A tungsten nitride thin film is deposited over the second insulating layer and the exposed metal line. A blanket tungsten thin film is deposited successively to the depositing of the tungsten nitride thin film so as to fill the contact hole and to form a planar layer. A chemical-mechanical polishing is applied so as to remove the tungsten and tungsten nitride films on the field region in order to form tungsten-plugs.

In accordance with a second aspect of the present invention, the tungsten nitride thin film may be suitably used for forming contact gates in Flash EEPROM memory devices. In a third aspect of the present invention, the tungsten nitride thin film may be suitably used for forming local interconnects to CMOS gate structures.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENTS

The barrier layer formation of the present invention will be described as incorporated into a tungsten plug structure of FIG. 1(e). However, it should be clearly understood to those skilled in the art that the barrier layer formation method according to the principles of the instant invention is equally applicable for forming a contact gate (wordline) in Flash EEPROM memory devices or for forming local interconnects to CMOS gate structures. By utilizing the barrier layer formation of the present invention, the tungsten plug structure of FIG. 1(e) can be produced at a lower cost in a single chamber. Further, the tungsten plug structure has a lower resistivity and a higher thermal stability than the conventional tungsten plug utilizing a titanium nitride barrier layer.

Figure 1A:
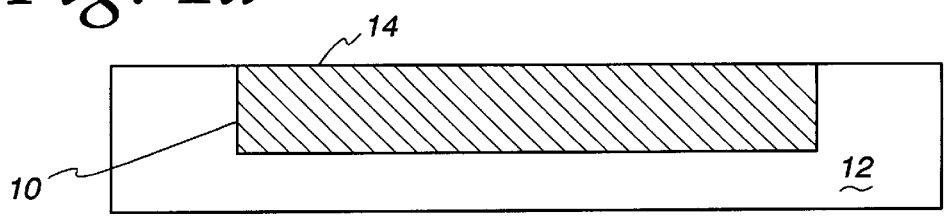
FIGS. 1(a) through 1(e) are cross-sectional views, illustrating the manufacturing steps for fabricating a tungsten plug in accordance with the principles of the present invention.

The tungsten plug formation process of the present invention will now be described with reference to the manufacturing steps shown in FIGS. 1(a) through 1(e). In FIG. 1(a), a metal line 10 is formed in a top portion of a first insulating layer 12. The metal line 10 is formed preferably of a metallic material such as copper (Cu). The first insulating layer 12 may be made of any typical and well-known dielectric material used in wafer fabrication of integrated circuits and is preferably silicon dioxide or a hydro-carbon material. Dependent upon the specific structure of the copper metal line 10, the exposed surface thereof designated as reference numeral 14 may be copper, copper silicide, or titanium nitride.

Figure 1B:
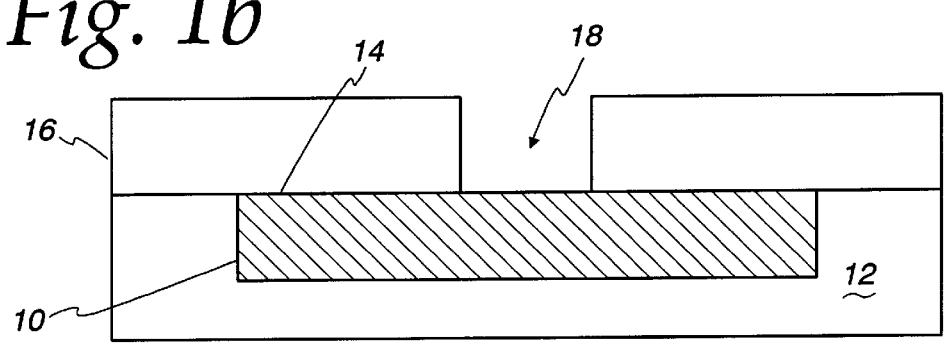

Next, a second layer 16 is formed over the surface of the first insulating layer 12 and the copper metal line 10. The second insulating layer 16 is also preferably a silicon dioxide or a hydro-carbon material. Then, a contact hole 18 extending down to the copper metal line 10 is formed in the second insulating layer 16 using conventional photolithographic and dry-etching techniques. It should be appreciated by those skilled in the art that since the contact hole 18 extends down to the metal line 10 this method is used to form a tungsten plug at the via level. This is illustrated in FIG. 1(b). Thereafter, a tungsten nitride ($WN_x$) thin film 20 is deposited by using a plasma-enhanced chemical vapor deposition chamber, where x is between 0.4 to 0.5. The deposition is carried out at a temperature of 300° C. to 450° C. A reactant gas mixture containing tungsten hexafluoride ($WF_6$), $NF_3$, and hydrogen ($H_2$) are injected into the chamber via flowmeters. The thickness of the $WN_x$ thin film 20 can be in the range of 50 Å to 1000 Å.

Figure 1C:
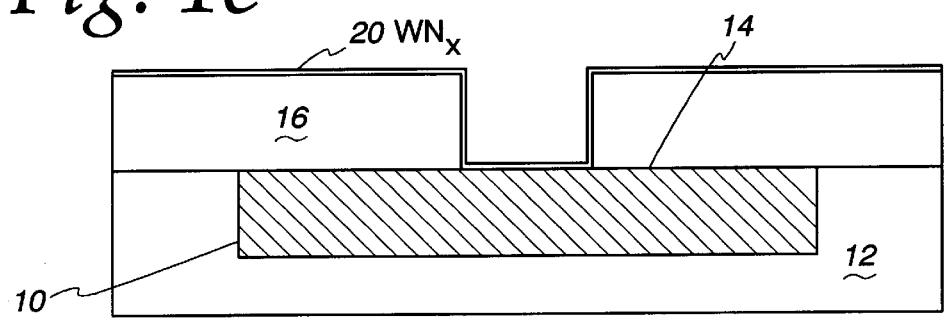

This is depicted in FIG. 1(c). By using this gas mixture of $WF_6$, $NF_3$, and $H_2$ there is eliminated a nucleation step in which a seed layer or particle is required.

Figure 1D:
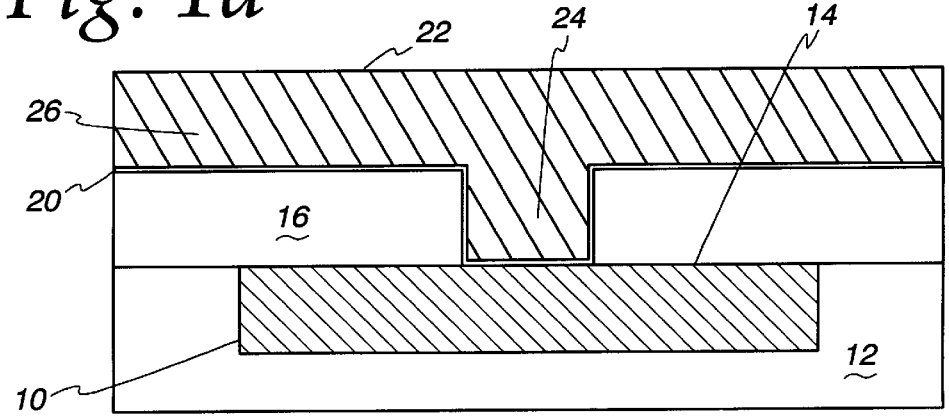

Following this, there is illustrated in FIG. 1(d) the step that is undertaken to deposit a blanket tungsten (W) thin film 22 in a predetermined thickness with in situ process, e.g., successively by means of the same CVD chamber until the contact hole 18 is buried therewith. In other words, the deposition of the tungsten thin film is performed immediately after the depositing of the $WN_x$ thin film 20 using the plasma-enhanced CVD in the same chamber by merely changing the deposition conditions, such as the ratio of the reactant gas mixture, flow rates, temperature and the like. Tungsten deposition is continued for a sufficient period of time so as to substantially fill the contact hole 18 with a tungsten plug 24, and a substantially planar layer of tungsten 26 is deposited on the upper surface of the structure.

Figure 1E:
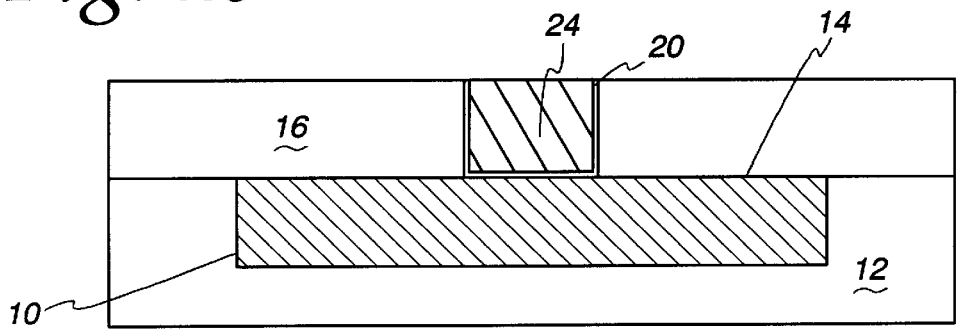

With reference to FIG. 1(e), there is shown the finished tungsten plug structure which is formed by chemical-mechanical polishing (CMP) of the tungsten nitride thin film 20 and the blanket tungsten thin film 22 until the upper surface of the second insulating layer 16 is exposed. It will be noted that since tungsten nitride and tungsten have substantially the same chemical properties in terms of chemical-mechanical polishing, there is required only one removal step for both the tungsten nitride and the tungsten, thereby further simplifying the number of process steps and reducing manufacturing costs. An upper metal line (not shown) is generally applied to the surface of the tungsten plug when carrying out a multi-layer wiring process so as to vertically connect to the copper metal line 10 via the contact hole 18.

As previously pointed out, it should be clear that the tungsten plug structure of FIG. 1(e) is but one example of an application where tungsten nitride thin film has been found to be a suitable replacement for titanium nitride and is deposited prior to the formation of tungsten thin film in the same deposition chamber. Specifically, a further application of the present invention using the tungsten nitride thin film may be suitably used for forming contact gates (wordlines) in Flash EEPROM memory devices. As is generally well-known, in conventional contact gate applications tungsten silicide ($WSi_x$) is typically used since it has a reduced contact resistance even though it has a relatively higher resistivity than tungsten contacts. However, again there would be required two different types of deposition chambers.

The inventors of the present invention utilize an in situ tungsten nitride/tungsten process in a single CVD chamber instead of using tungsten silicide. Consequently, there is obtained a lower production cost. Moreover, the finished contact gate has a lower resistivity than the silicide and is relatively easier to etch. Since the tungsten nitride and tungsten have substantially identical chemical properties in terms of dry etch, only one removal step is required. The deposition of the tungsten nitride thin film is again performed with a gas mixture of $WF_6$, $NF_3$, and $H_2$. Thus, there is avoided the need of a seed layer or particles.

Figure 2:
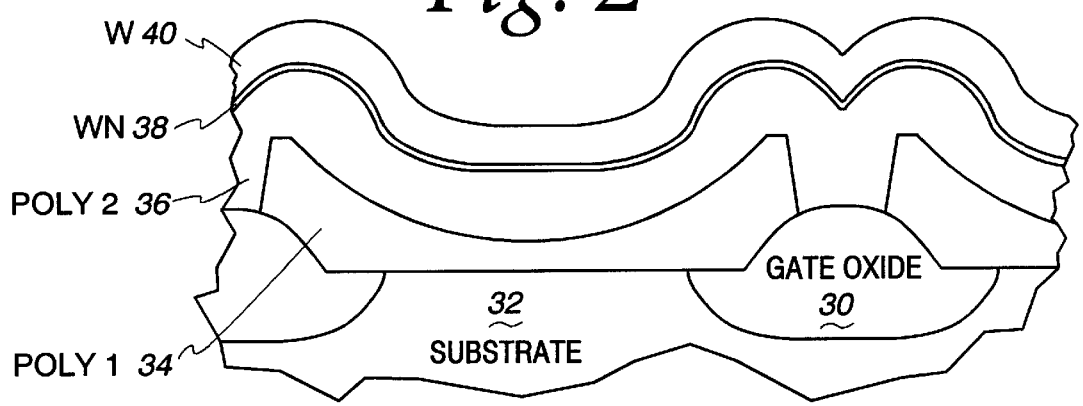
FIG. 2 is a cross-sectional representation of a control gate structure incorporating the $WN_x/W$ process of the present invention.

The formation of a control gate structure will now be described with reference to FIG. 2. First, a gate oxide region 30 is formed on a silicon substrate 32. A first polysilicon (poly 1) film 34 is then formed over the gate oxide region 30. Next, a second polysilicon (poly 2) film 36 is formed on the top surface of the poly 1. Thereafter, the step of depositing a tungsten nitride thin film 38 using a plasma-enhanced CVD is performed which is substantially the same as described in conjunction with the process step of FIG. 1(c) for manufacturing the tungsten plug disclosed above. The step of depositing a tungsten layer 40 is then performed in situ using the same deposition chamber.

A still further application of the present invention using the tungsten nitride thin film may be suitably used for forming local interconnects to CMOS gate structures. As is generally well-known to those skilled in the art, the conventional method for producing Local Interconnects (LI) involves the steps of: (1) depositing a titanium or a cobalt, followed by annealing for silicidation at contact regions and gate-polysilicon regions, wet-etching to remove non-reactive titanium or cobalt on $SiO_2$ regions, and annealing to reduce the silicide resistivity; (2) depositing an interlayer dielectric (ILD) over the silicide layer; (3) etching the local interconnect pattern on the ILD; (4) depositing then a Ti/TiN barrier layer; (5) depositing tungsten by CVD to fill the patterned lines; and (6) performing a chemical-mechanical polishing to leave the tungsten interconnect. Again, the disadvantage of the conventional method for producing the local interconnect is that it requires two separate deposition chambers for the barrier layer. In particular, the depositing of titanium needs the use of a first physical vapor deposition (PVD) chamber and the depositing of titanium nitride needs the use of a second PVD chamber or a CVD chamber.

Figure 3:
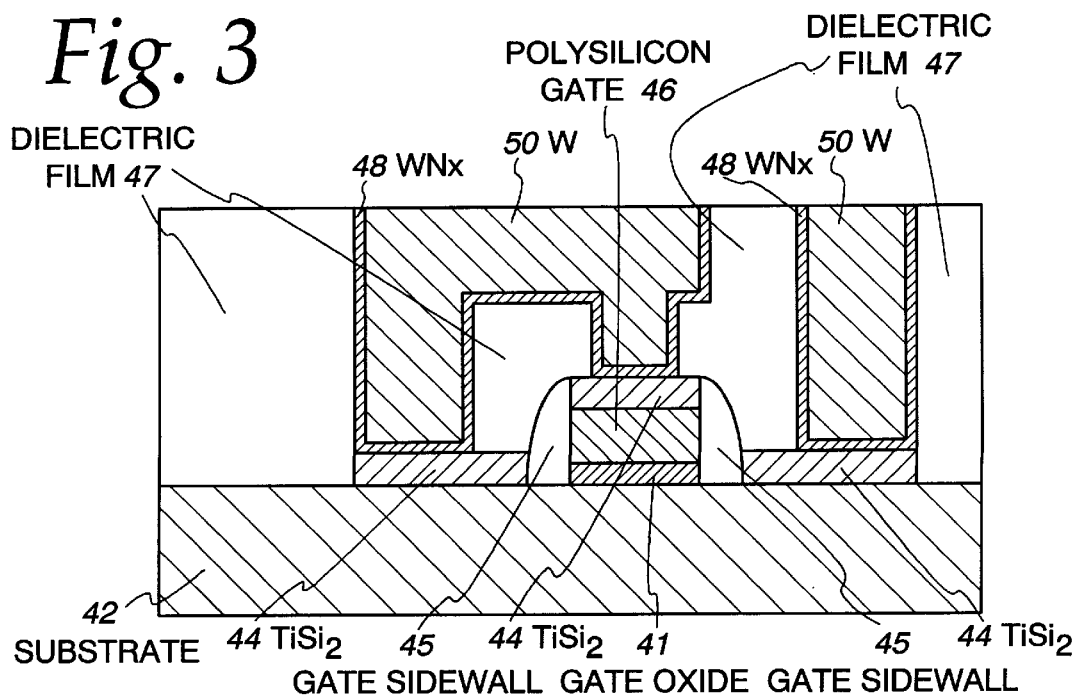
FIG. 3 is a cross-sectional representation of a local interconnect incorporating the $WN_x/W$ process of the present invention.

The purpose of the present invention is to reduce manufacturing costs by decreasing the number of steps required. In this manner, the use of a single chamber is proposed for depositing of both the tungsten nitride thin film and the tungsten thin film. Such a local interconnect structure is shown in FIG. 3 where a gate oxide layer 41 and a polysilicon layer 46 are initially formed over a silicon substrate 42. Then, a titanium layer is formed by PVD, followed by annealing to form a titanium silicide ($TiSi_2$) layer 44 as a result of reaction of the titanium layer with a top part of the polysilicon layer 46. Then, non-reacted titanium layer, which is located on $SiO_2$ layers such as gate-sidewalls 45 and field oxide layers, is stripped by wet-etching. Then, annealing at a temperature higher than the previous annealing is performed so as to reduce the silicide layer 44. Then, dielectric layer 47 is formed by CVD to cover the whole region. The dielectric layer is etched to form the contact holes and local interconnect patterns.

A tungsten nitride thin film 48 is deposited using a plasma-enhanced CVD chamber. Immediately following, tungsten 50 is deposited in situ using the same chamber. The tungsten/tungsten nitride layer (50, 48) located over the polysilicon gate 46 and the titanium silicide layer 44 form the LI structure. After the step of dry etch and chemical-mechanical polishing, the finished local interconnect formation is depicted in FIG. 3.

From the foregoing detailed description, it can thus be seen that the present invention provides a method of fabricating a tungsten plug which deposits a tungsten nitride barrier layer prior to the chemical vapor deposition of tungsten in a single chamber. The present invention is also applicable for forming a contact gate in Flash EEPROM memory devices or for forming local interconnects to CMOS gate structures. As a result, there is realized a higher through-put and a lower production cost.

While there has been illustrated and described what are at present considered to be preferred embodiments of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiments disclosed as the best modes contemplated for carrying out the invention, but that the invention will include all embodiments falling within the scope of the appended claims.

What is claimed is:

1. A method of fabricating a tungsten plug at the via level comprising the steps of:

forming a metal line in a top portion of a first insulating layer;

forming a second insulating layer on said first insulating layer and over an exposed surface of said metal line;

applying an etching process to a region of said second insulating layer formed over the exposed surface of said metal line to create a contact hole within said region, said metal line being exposed at the region;

depositing in a plasma-enhanced CVD chamber a tungsten nitride thin film with a thickness of 50 Å to 1,000 Å over said second insulating layer and said exposed metal line;

said step of depositing tungsten nitride includes the step of injecting a reactant gas mixture containing $WF_6$, $NF_3$, and $H_2$;

depositing in situ in the same CVD chamber a blanket tungsten thin film to fill the contact hole and to form a planar layer successively to the depositing of said tungsten nitride thin film; and applying a chemical-mechanical polishing to polish said tungsten nitride thin film and said blanket tungsten thin film until the upper surface of said second insulating layer is exposed.

2. A method of fabricating a tungsten plug as claimed in claim 1, wherein said metal line is formed of copper.

* * * * *